n(12) United States Patent
Lee et al.

(10) Patent No.: US 11,432,434 B2
(45) Date of Patent: Aug. 30, 2022

(54) APPARATUS AND METHOD FOR MODIFYING AIRFLOW OF A NETWORK ELEMENT

(71) Applicant: Ciena Corporation, Hanover, MD (US)

(72) Inventors: Cindy Lee, Kanata (CA); Kevan Peter Jones, Ottawa (CA); Michael R. Bishop, Nepean (CA)

(73) Assignee: Ciena Corporation, Hanover, MD (US)

( * ) Notice: Subject to any disclaimer, the term of this patent is extended or adjusted under 35 U.S.C. 154(b) by 33 days.

(21) Appl. No.: 17/113,366

(22) Filed: Dec. 7, 2020

(65) Prior Publication Data
US 2022/0183188 A1 Jun. 9, 2022

(51) Int. Cl.
*H05K 7/20* (2006.01)
*H05K 7/14* (2006.01)

(52) U.S. Cl.
CPC ....... *H05K 7/20727* (2013.01); *H05K 7/1491* (2013.01); *H05K 7/20145* (2013.01)

(58) Field of Classification Search
CPC ........... H05K 7/20736; H05K 7/20145; H05K 7/20754; H05K 7/20172; H05K 7/20572; H05K 7/20581; H05K 7/20181; H05K 7/20718; H05K 7/20; H05K 7/20972; H05K 7/20909; G06F 1/20; G06F 2200/201
USPC ..... 361/695, 679.48, 690, 694, 724, 679.46, 361/679.51, 678, 679.49, 688, 692, 361/679.33, 679.5, 679.01, 796; 165/104.33, 80.3, 53
See application file for complete search history.

(56) References Cited

U.S. PATENT DOCUMENTS

| | | | |
|---|---|---|---|
| 5,485,299 A | 1/1996 | Jones | |
| 5,528,454 A * | 6/1996 | Niklos | H05K 7/20581 361/679.48 |
| 6,104,611 A | 8/2000 | Glover et al. | |
| 6,275,331 B1 | 8/2001 | Jones et al. | |
| 6,310,994 B1 | 10/2001 | Jones et al. | |
| 6,542,233 B1 | 4/2003 | Bray et al. | |
| 6,621,621 B1 | 9/2003 | Jones et al. | |
| 6,646,795 B1 | 11/2003 | Jones et al. | |
| 6,748,154 B2 | 6/2004 | O'Leary et al. | |
| 6,751,414 B1 | 6/2004 | Davies et al. | |
| 6,831,844 B1 | 12/2004 | Lee et al. | |
| 6,888,069 B1 | 5/2005 | Chen et al. | |
| 7,843,630 B2 | 11/2010 | Van Schyndel et al. | |
| 8,090,259 B2 | 1/2012 | Leclair et al. | |
| 8,385,064 B1 * | 2/2013 | Smith | H05K 7/20727 361/679.48 |
| 8,514,571 B2 * | 8/2013 | Ji | H05K 7/20572 361/679.48 |

(Continued)

*Primary Examiner* — Mandeep S Buttar
(74) *Attorney, Agent, or Firm* — Clements Bernard Baratta; Lawrence A. Baratta, Jr.; Christopher L. Bernard

(57) ABSTRACT

A system includes a network element having a housing that is configured for front-to-rear airflow; and a cooling apparatus located adjacent to the network element and having a housing that forms a cavity that is closed by the housing of the network element, wherein the cooling apparatus includes one or more fan units that are accessible via front access and wherein the one or more fan units are configured to draw the front-to-rear airflow from the network element into the cavity. This enables a front-to-back airflow design with rear fan access to be converted into a front-to-back airflow design with front fan access.

18 Claims, 8 Drawing Sheets

(56) References Cited

U.S. PATENT DOCUMENTS

| | | |
|---|---|---|
| 8,542,992 B2 | 9/2013 | Jones et al. |
| 8,670,664 B2 | 3/2014 | Leclair et al. |
| 8,811,822 B2 | 8/2014 | Leclair et al. |
| 9,769,959 B2 | 9/2017 | Mayenburg et al. |
| 9,817,201 B2 | 11/2017 | Lee et al. |
| 9,839,155 B2 * | 12/2017 | Fleming ................. B23P 19/00 |
| 10,027,435 B2 | 7/2018 | Guy et al. |
| 10,070,553 B2 | 9/2018 | Lee et al. |
| 10,368,149 B2 | 7/2019 | Jones et al. |
| 10,644,824 B1 | 5/2020 | Grammel et al. |
| 10,729,037 B1 | 7/2020 | Shearman et al. |
| 10,735,125 B2 | 8/2020 | Jones |
| 11,044,834 B1 * | 6/2021 | Lau .................... H05K 7/20272 |
| 2003/0016414 A1 | 1/2003 | Solheim et al. |
| 2003/0151799 A1 | 8/2003 | Wight et al. |
| 2004/0052526 A1 | 3/2004 | Jones et al. |
| 2004/0100684 A1 | 5/2004 | Jones et al. |
| 2004/0208504 A1 | 10/2004 | Solheim et al. |
| 2011/0267775 A1 * | 11/2011 | VanDerVeen ...... H05K 7/20736<br>361/692 |

* cited by examiner

APPARATUS AND METHOD FOR MODIFYING AIRFLOW OF A NETWORK ELEMENT

FIELD OF THE DISCLOSURE

The present disclosure generally relates to networking hardware. More particularly, the present disclosure relates to an apparatus and method for modifying a network element's airflow.

BACKGROUND OF THE DISCLOSURE

Network elements are physical nodes in a network, computing cluster, storage system, cloud, etc. The network elements are formed with physical hardware that can be located in data centers, Central Offices (CO), Points-of-Presence (POP), shelters, huts, customer premises locations, etc. A network element can include a shelf or chassis that includes physical hardware that supports electrical and/or optical components. There are various embodiments, including removable modules that are inserted in the chassis, an integrated unit formed in the chassis referred to as a "pizza box," and the like. A chassis can be mounted in a rack or frame, housed in a cabinet, or the like. Also, there is a requirement for cooling in the chassis, and typical embodiments include front-to-rear airflow with fans located at the rear of a chassis, front-to-side airflow with fans located at the side or rear of the chassis, and the like. A typical example of a network element can include a 1-2 Rack Unit (RU) high chassis or pizza box that includes fans located at the rear. As known in the art, an RU is a measurement of height and equals 1.75 inches. There are scenarios where such a network element is deployed in a cabinet or frame with no rear access, such as to replace fans. There needs to be rear access so that fans can be replaced while the network element operates in-service.

One solution for rear access in this situation is to have the chassis slide forward enough so that a technician can reach behind the unit for maintenance. This approach requires managing fiber slack so the unit can slide forward while still operating. An example of this approach is described in commonly-assigned U.S. patent application Ser. No. 16/683,372, filed Nov. 14, 2019, and entitled "Fiber Management Sliding Tray System," the contents are incorporated by reference herein. Of course, this approach works better with optical fibers than it does with electrical cabling.

There are other issues with this sliding approach; namely, a technician still needs to reach behind the unit to access the fans, this approach works better with optical fibers than it does with electrical cabling (copper cable slack), and the airflow in this approach is still front-to-back which can be problematic in a cabinet where there is no rear exhaust.

BRIEF SUMMARY OF THE DISCLOSURE

The present disclosure relates to an apparatus and method for modifying the airflow of a network element. The apparatus converts a front-to-back airflow design with rear fan access, on an existing network element, into a front-to-side airflow design with front fan access while staying within the original product's footprint. In another embodiment, the apparatus can convert a front-to-back airflow design with rear fan access into a front-to-back airflow design with front fan access. This is achieved by adding new ducting and a new fan tray (the apparatus) to the design, which increases the overall height of the product. However, no change is required to the fiber or copper cable routing from the existing product to the network element. That is, the present disclosure enables the fans to be replaced without rear access and without moving the network element while in-service. Advantageously, this apparatus meets a key requirement of network operators to place a network element with front-to-back airflow and rear-access fan units into a cabinet with only front access and no rear exhaust cabinet.

In an embodiment, a system includes a network element having a housing that is configured for front-to-rear airflow; and a cooling apparatus located adjacent to the network element and having a housing that forms a cavity that is closed by the housing of the network element, wherein the cooling apparatus includes one or more fan units that are accessible via front access and wherein the one or more fan units are configured to draw the front-to-rear airflow from the network element into the cavity.

The one or more fan units can be located on a side of the cooling apparatus and can be configured to exhaust air in the cavity on the side of the cooling apparatus, thereby converting the front-to-rear airflow to front-to-side airflow. The cavity can include a baffle for airflow in the cavity.

The one or more fan units can be located at a rear of the cooling apparatus. The one or more fan units can be oriented horizontally and configured to draw the front-to-rear airflow downward into a duct for exhaust out a rear side of the cooling apparatus. The one or more fan units can be oriented vertically and configured to draw the front-to-rear airflow into the cavity for exhaust out each side of the cooling apparatus.

The cooling apparatus can include fiber and/or cable management on a front side. The cooling apparatus can be 1 Rack Unit (RU) in height. The network element can require rear access for fan replacement and is deployed where rear access is unavailable. The network element can support fan units on a rear side and the fan units are unequipped with the cooling apparatus present.

In another embodiment, a cooling apparatus includes a housing having a front side, a rear side, a left side, a right side, and a bottom side, collectively forming a cavity; and one or more fan units located in the cavity and accessible from the front side; wherein the cooling apparatus is placed adjacent to a network element having a housing that is configured for front-to-rear airflow, wherein the cavity is closed by the housing of the network element, and wherein the one or more fan units are configured to draw the front-to-rear airflow from the network element into the cavity.

The one or more fan units can be located on a side of the cooling apparatus and can be configured to exhaust air in the cavity on the side of the cooling apparatus, thereby converting the front-to-rear airflow to front-to-side airflow. The one or more fan units can be located at a rear of the cooling apparatus.

The one or more fan units can be oriented horizontally and configured to draw the front-to-rear airflow downward into a duct for exhaust out a rear side of the cooling apparatus. The one or more fan units can be oriented vertically and configured to draw the front-to-rear airflow into the cavity for exhaust out each side of the cooling apparatus.

The cooling apparatus can include fiber and/or cable management on a front side. The cooling apparatus can be 1 Rack Unit (RU) in height. The network element can require rear access for fan replacement and is deployed where rear access is unavailable.

In a further embodiment, a method includes deploying a network element having a housing that is configured for front-to-rear airflow; and deploying a cooling apparatus located adjacent to the network element and having a housing that forms a cavity that is closed by the housing of the network element, wherein the cooling apparatus includes one or more fan units that are accessible via front access and wherein the one or more fan units are configured to draw the front-to-rear airflow from the network element into the cavity. The one or more fan units can be located on a side of the cooling apparatus and can be configured to exhaust air in the cavity on the side of the cooling apparatus, thereby converting the front-to-rear airflow to front-to-side airflow.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to an apparatus and method for modifying the airflow of a network element. The apparatus converts a front-to-back airflow design with rear fan access, on an existing network element, into a front-to-side airflow design with front fan access while staying within the original product's footprint. In another embodiment, the apparatus can convert a front-to-back airflow design with rear fan access into a front-to-back airflow design with front fan access. This is achieved by adding new ducting and a new fan tray (the apparatus) to the design, which increases the overall height of the product. However, no change is required to the fiber or copper cable routing from the existing product to the network element. That is, the present disclosure enables the fans to be replaced without rear access and without moving the network element while in-service. Advantageously, this apparatus meets a key requirement of network operators to place a network element with front-to-back airflow and rear-access fan units into a cabinet with only front access and no rear exhaust cabinet.

Figure 1:
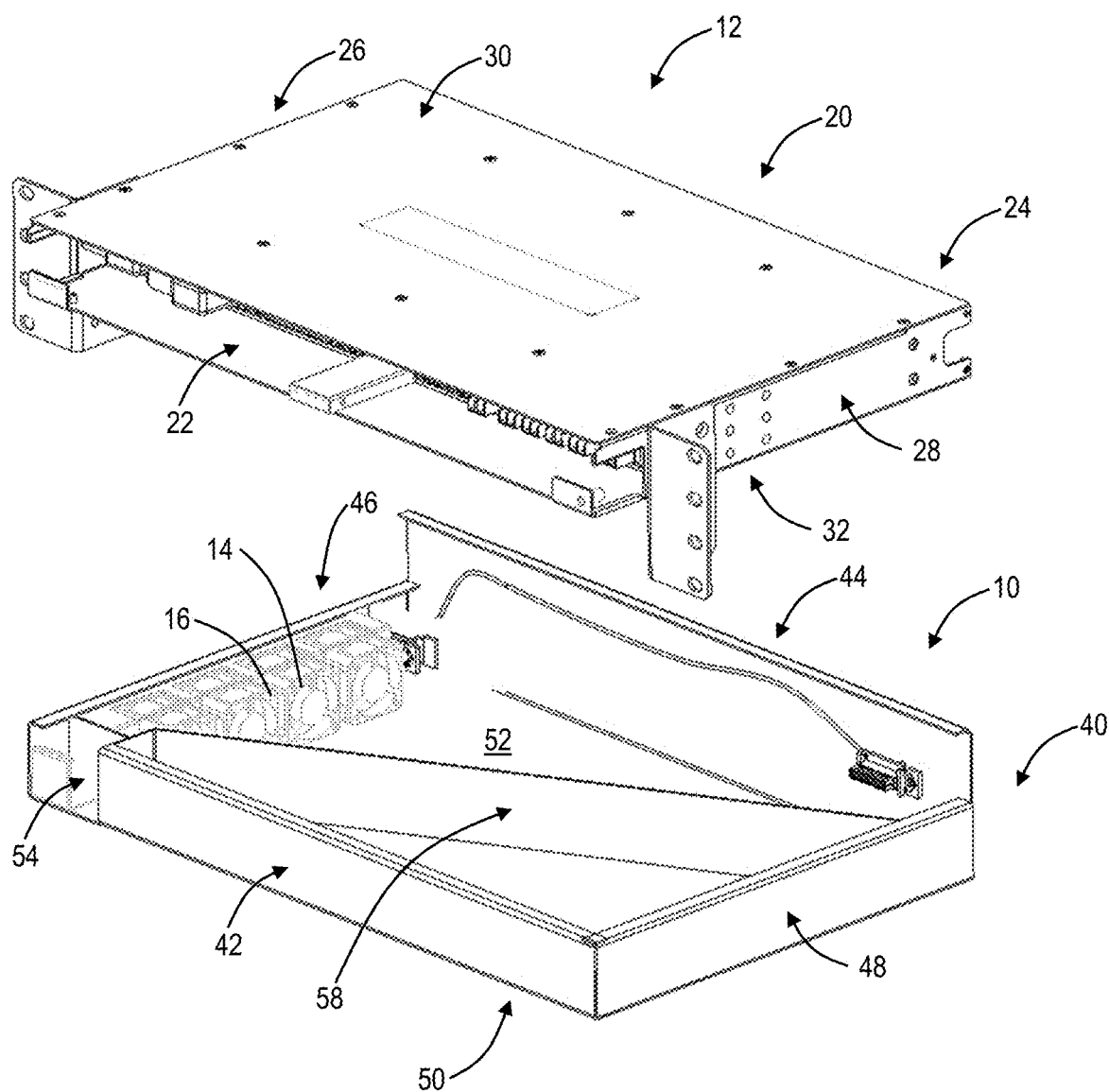
FIG. 1 is a front perspective view of a cooling apparatus with a network element for modifying the airflow thereof, namely causing front-to-back airflow in the network element to become front-to-side airflow via the cooling apparatus.
Figure 2:
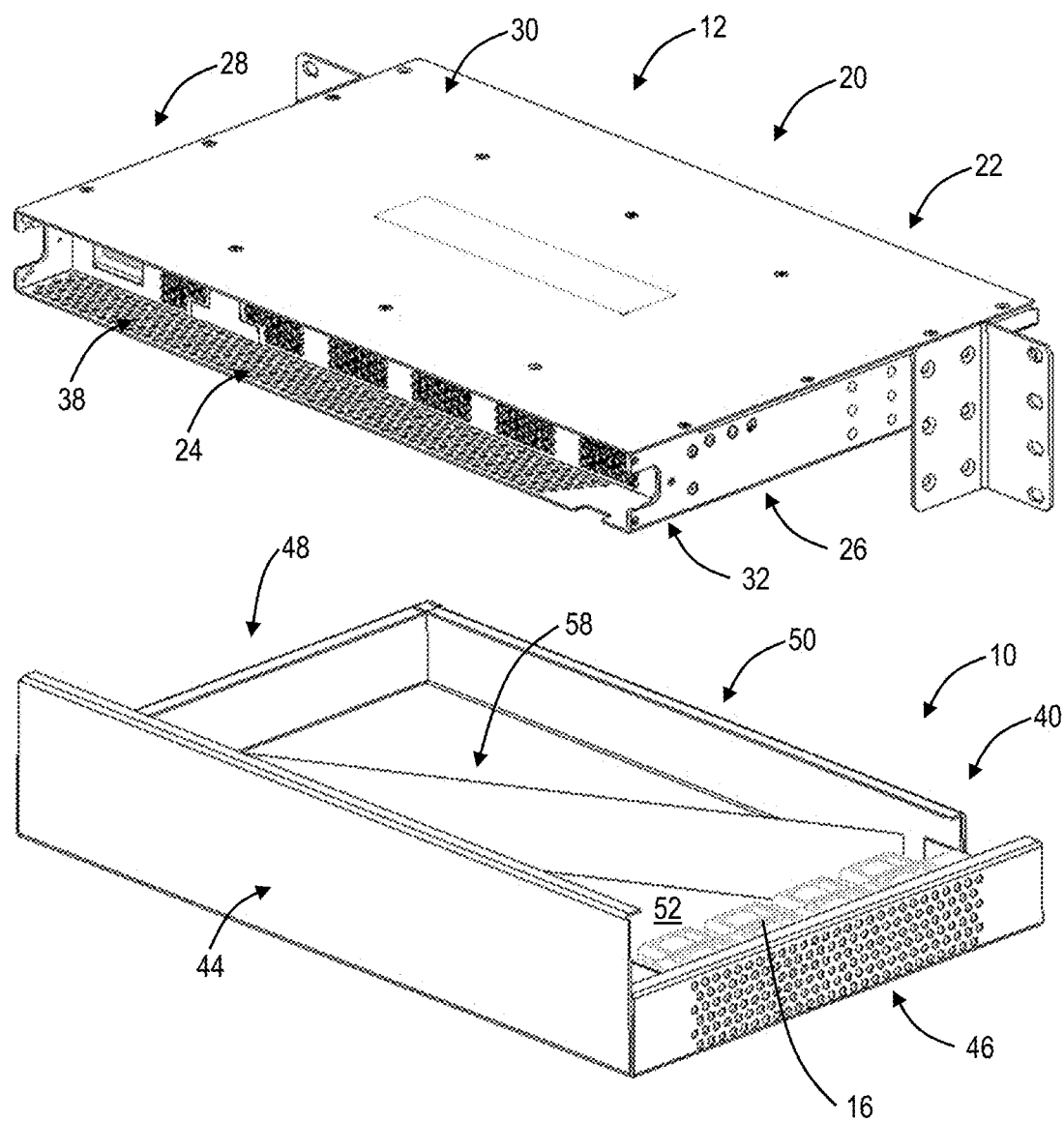
FIG. 2 is a rear perspective view of the cooling apparatus with the network element.
Figure 3:
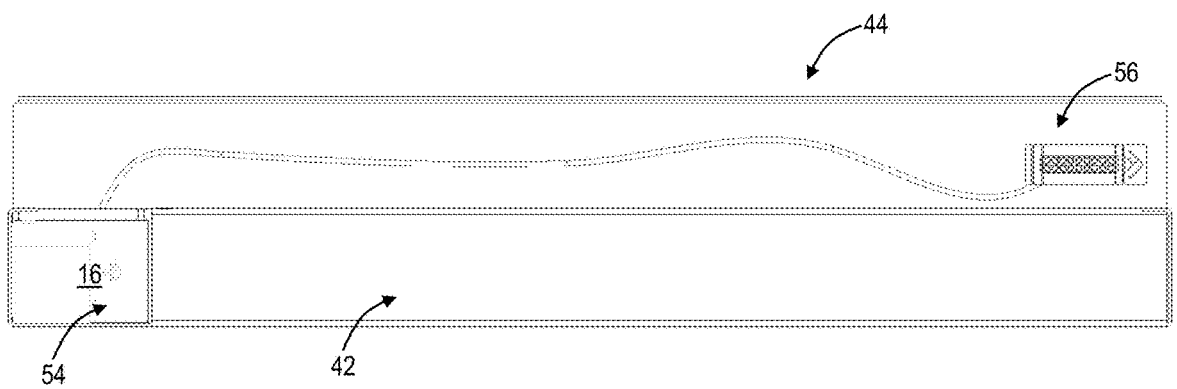
FIG. 3 is a front view of the cooling apparatus.
Figure 4:
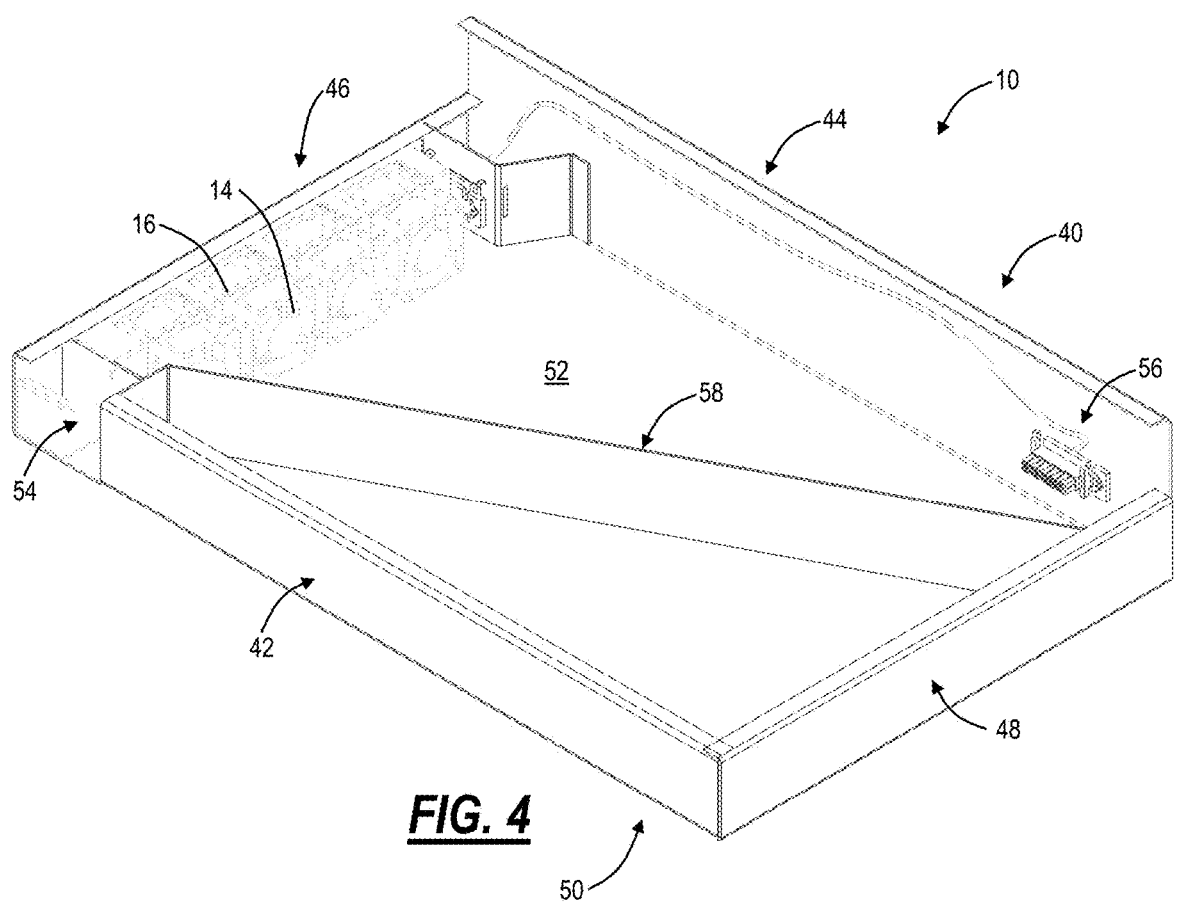
FIG. 4 is a front perspective view of the cooling apparatus.
Figure 5:
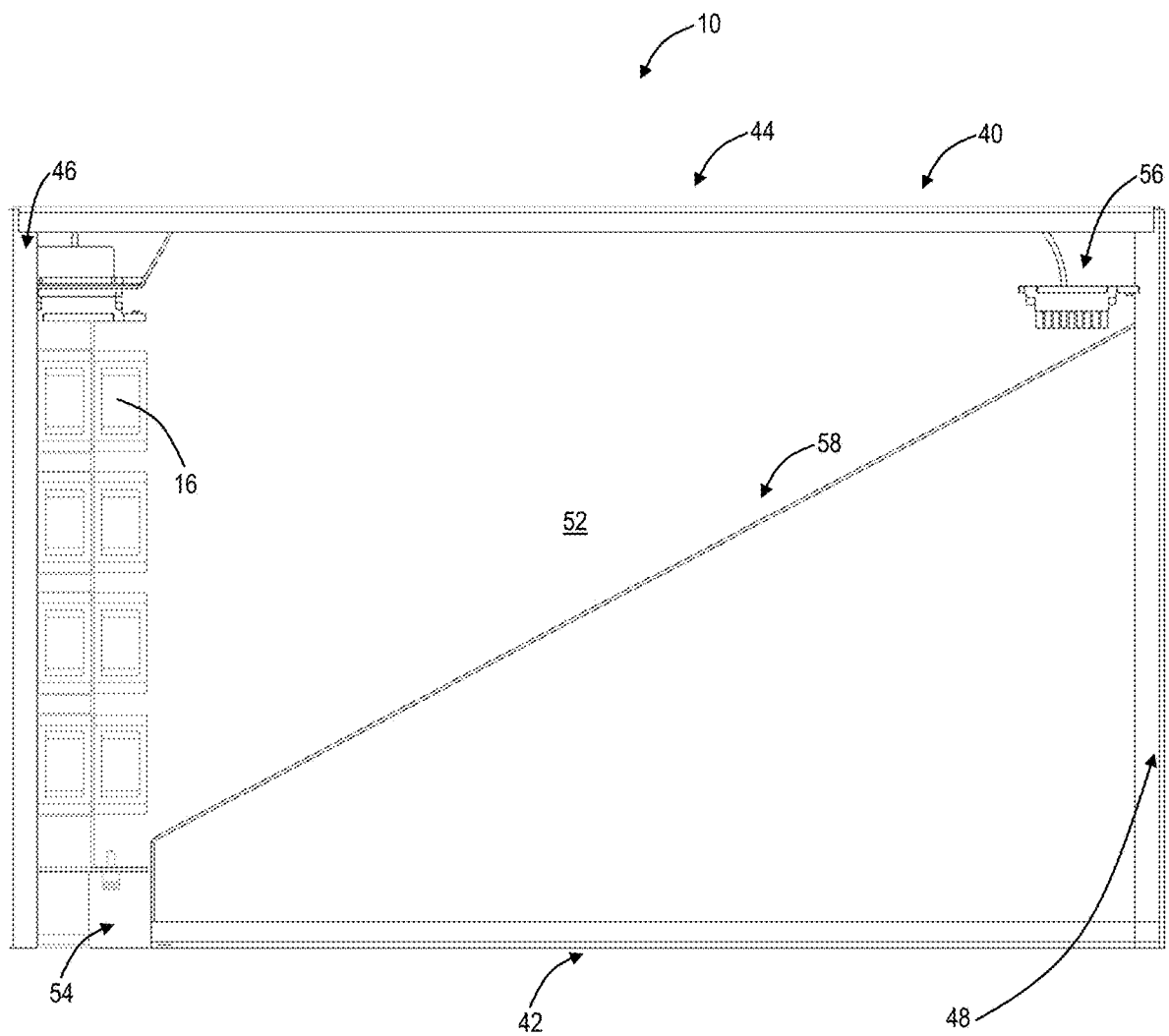
FIG. 5 is a top view of the cooling apparatus.
Figure 6:
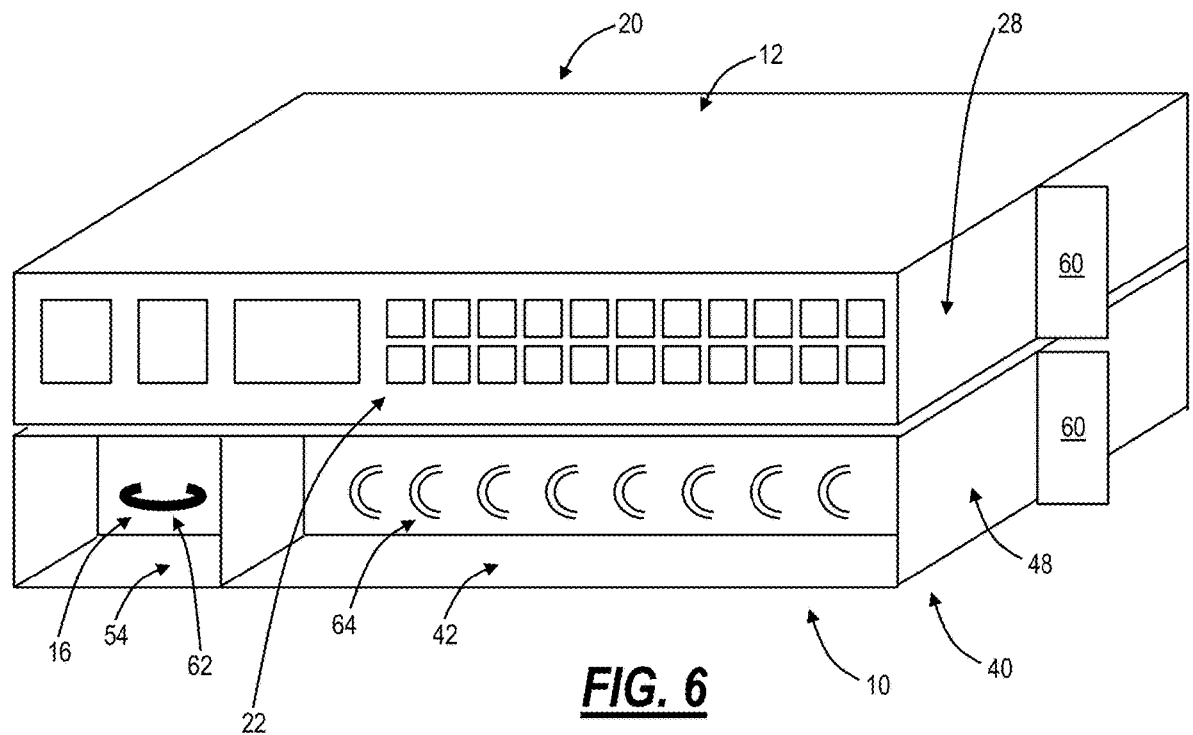
FIG. 6 is a front perspective view of the network element configured with the cooling apparatus.
Figure 7:
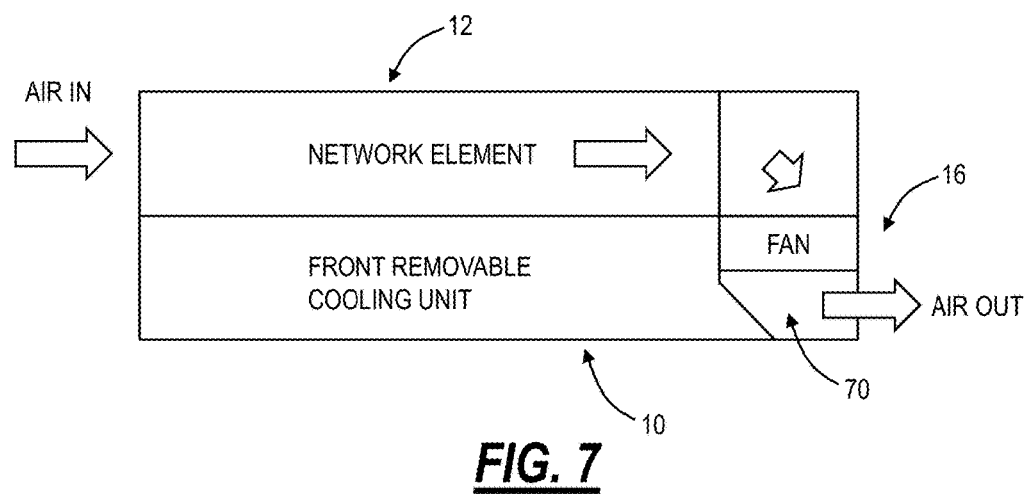
FIG. 7 is a side functional view of another embodiment where the front-to-back airflow remains but fans in the cooling unit are accessible from the front of the network element and the cooling unit.
Figure 8:
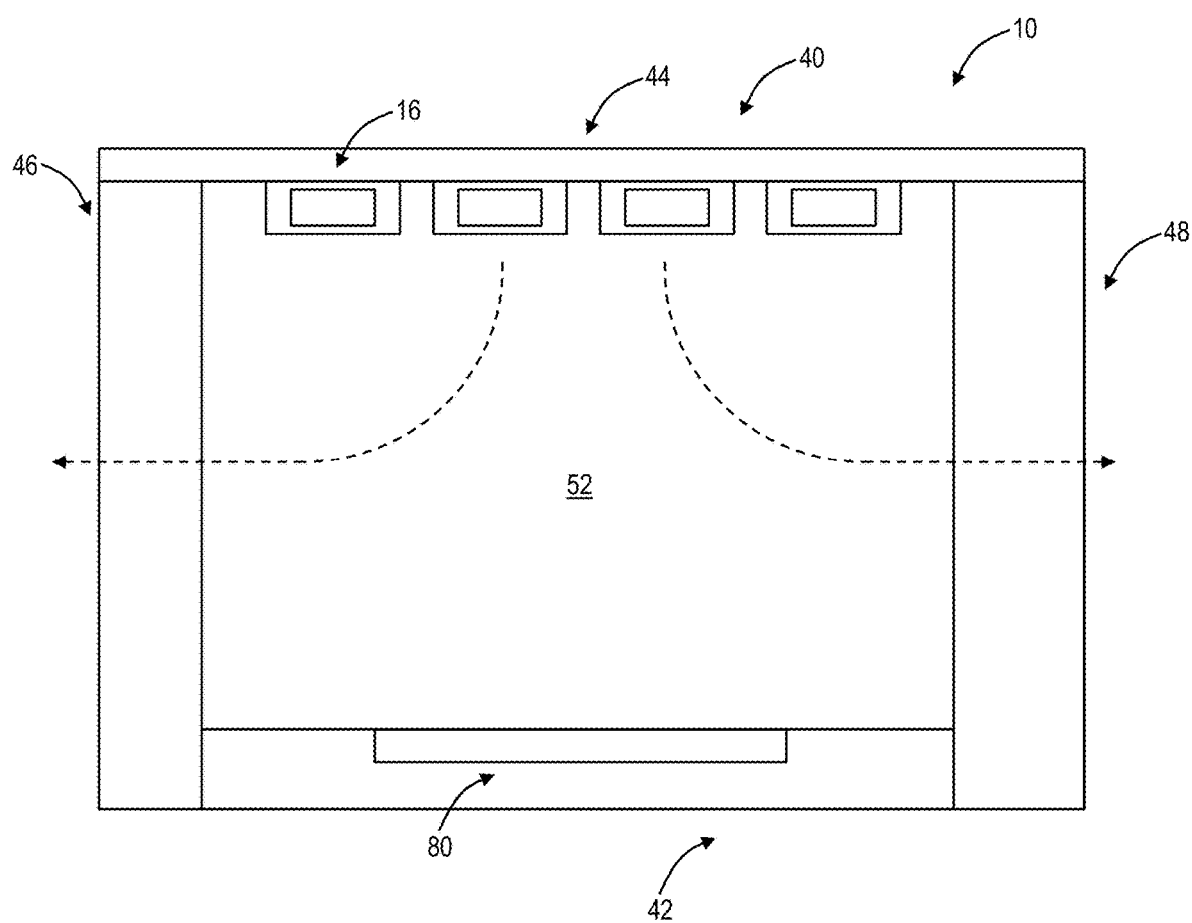
FIG. 8 is a top view of the cooling apparatus in a further embodiment where the fans are located at the rear of the cooling apparatus.
Figure 9:
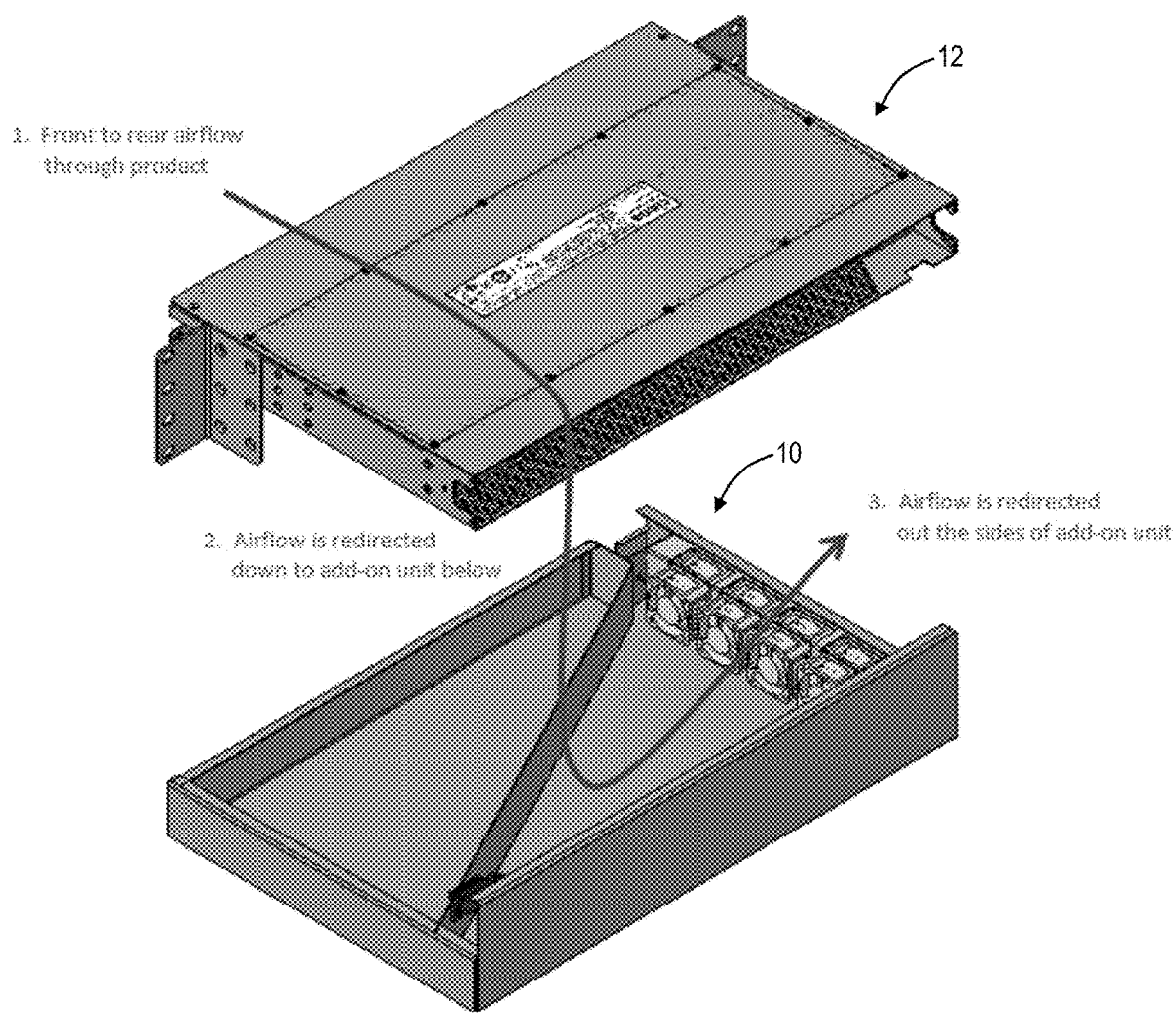
FIG. 9 is a rear perspective view of the cooling apparatus with the network element illustrating airflow direction.

FIG. 1 is a front perspective view of a cooling apparatus 10 with a network element 12 for modifying the airflow thereof, namely causing front-to-back airflow in the network element to become front-to-side airflow via the cooling apparatus 10. FIG. 2 is a rear perspective view of the cooling apparatus 10 with the network element 12. FIG. 3 is a front view of the cooling apparatus 10. FIG. 4 is a front perspective view of the cooling apparatus 10. FIG. 5 is a top view of the cooling apparatus 10. FIG. 6 is a front perspective view of the network element 12 configured with the cooling apparatus 10. FIG. 7 is a side functional view of another embodiment where the front-to-back airflow remains, but fan units 14 in a fan tray 16 the cooling apparatus 10 are accessible from the front of the network element 12 and the cooling apparatus 10. FIG. 8 is a top view of the cooling apparatus 10 in a further embodiment where the fan units 14 are located at the rear of the cooling apparatus 10. FIG. 9 is a rear perspective view of the cooling apparatus 10 with the network element 12 illustrating airflow direction.

Variously, the cooling apparatus 10 is configured to be rack or cabinet mounted with the network element 12 located immediately above the cooling apparatus 10. Of note, in other embodiments, the network element 12 can be located immediately below the cooling apparatus 10. The cooling apparatus 10 is configured to either modify the airflow of the network element 12 and/or to provide access to fan units 14 from the front of the rack or cabinet. An example use case involves a cabinet mounted network element 12 where there is no rear access and where the network element 12 requires rear access for a fan replacement, for example. The fan units 14 in the cooling apparatus 10 are replaceable from the front, in-service, without moving or disrupting the network element 12. In the various examples described herein, the network element 12 is shown as a 1 RU device, but those skilled in the art will appreciate it can be higher (e.g., 2-3 RUs or more). The network element 12 is an existing device which requires rear access for replacing fans. With the cooling apparatus 10, the network element 12 is deployed without fans and relies on the cooling apparatus 10 to provide the fans and airflow. The cooling apparatus 10 can be a 1 RU unit as well although additional height is possible for higher network elements 12 to support larger fans. The addition of the cooling apparatus 10 adds height to the deployment but removes the requirement for rear access or for modifying the network element 12.

In an embodiment illustrated in FIGS. 1-6, the cooling apparatus 10 is used to convert a rear fan access, front-to-back airflow design of the network element 12 to front fan access, front-to-side airflow while staying within the rack mount profile of the chassis. The objective is to remain within the footprint of the original network element 12 with the cooling apparatus 10 as an add-on unit that simply adds height (e.g., 1 RU) to the design. The network element 12 is designed for rear access with front-to-back airflow that is sealed by a rear access fan tray. With the cooling apparatus 10, the rear access fan tray is removed in place of the cooling apparatus 10 that is an add-on front access Active Airflow Adapter. The cooling apparatus 10 closes the back of the original chassis of the network element 12 and directs air to the side using "pull" airflow. This allows the creation of front ingress, side exhaust airflow. The cooling apparatus 10 includes the fan tray 16 with fan units 14 that can be replaced via front access only.

This approach addresses the use case where rear access is impossible, e.g., a cabinet, etc. The cooling apparatus 10 only takes up 1 RU (1.75" of vertical rack space). The fan tray 16 will be front accessible. This approach with the cooling apparatus 10 does not affect the existing fiber or copper cable management of the network element 12. It is also possible to further use the front panel space of the cooling apparatus 10 to add a fiber guide for flexible slack management, using the additional rack unit for extra installation ease.

The network element 12 can be a packet switch, a router, an optical network element such as a Reconfigurable Optical Add/Drop Multiplexer (ROADM), a storage device, and the like. The network element 12 includes a housing 20 that generally has a rectangular shape for mounting in a rack, frame, cabinet, etc. The housing 20 includes a front side 22, a rear side 24, a left side 26, a right side 28, a top side 30, and a bottom side 32. The front side 22 can include optical ports, electrical ports, management access, visual indicators, etc., as well as vents for air ingress. The rear side 24 (FIG. 2) is configured with removable fan units (not shown). With the cooling apparatus 10, the removable fan units are unequipped on the rear side 24. Note, the bottom side 32 at the rear side 24 needs to have perforations 38 added to enable the airflow downward when the fan units (not shown) are not equipped in the rear side 24 of the network element 12.

In FIGS. 1-6, the cooling apparatus 10 is configured to modify the airflow of the network element 12 from front-to-back airflow to front-to-side airflow. To that end, the cooling apparatus 10, in the embodiment of FIGS. 1-6, includes a housing 40 that includes a front side 42, a rear side 44, a left side 46, a right side 48, and a bottom side 50. The cooling apparatus 10 does not include a top side, and the sides 42, 44, 46, 48, 50 form a cavity 52. Once deployed and installed, the bottom side 32 of the network element 12 is configured to sit on top of the cooling apparatus 10, closing the cavity 52.

In this 1 RU embodiment, the sides 42, 46, 48 are 1 RU in height, whereas the rear side 44 extends higher, such as 2 RU. The rear side 44 is configured to cover the rear side 24 of the network element and form a barrier closing off the rear side 24, thereby preventing rear air egress. Instead, the rear air egress from the network element 12 is redirected into the cavity 52 of the cooling apparatus 10.

The cooling apparatus 10 further includes fan units 14 in the fan tray 16 located at the left side 46 in the cavity, in the embodiment of FIGS. 1-6. Here, there are four fan units 14 in the fan tray 16, and they are accessible via the front side 42 via an opening 54. The fan tray 16 can be inserted and removed in the opening 54, in-service and via front access only. The cooling apparatus 10 includes a power connection 56 that can connect to the network element 12 or to a power connector on the rack or in the cabinet.

The cavity 52 can include a baffle 58 that segments the cavity 52. In this embodiment, the fan tray 16 is on the left side 46, and the baffle 58 extends diagonally to cut the cavity 52 in half. In this manner, there is more air pressure at the far end away from the fan units 14 to draw the hot air from the network element 12 to the left side 46.

FIG. 6 is a front view illustrating the network element 12 on top of the cooling apparatus 10. Note, both the cooling apparatus 10 and the network element 12 can have mounting brackets 60 that are used to mount the corresponding housings 20, 40 to a rack, frame, cabinet, etc. The fan tray 16 can have a handle 62 for removal and insertion in the opening 54. Also, the front side 42 of the cooling apparatus 10 can include fiber and/or cable management 64.

Other fan placement options may preclude the use of fiber management on the front but still meet all the other objectives. The embodiment in FIGS. 1-6 is focused on side exhaust specifically because the normal airflow for the design is front-to-back (i.e., rear exhaust). The application we with side exhaust may not be required in all cases.

FIG. 7 illustrates another embodiment where the cooling apparatus 10 maintains the same airflow, namely front-to-back airflow, but allows a front fan tray 16. In such an example, the front-mounted fan tray 16 would draw air from the rear side 24 of the network element 12 above and then have a duct 70 in the cooling apparatus 10 that would allow the (warm) air to be exhausted to the rear on the lower level. In this way, the cooling apparatus 10 supports a front removable fan unit that still maintains front-to-rear airflow. Note, the fan units 14 are located horizontally in this embodiment to draw the airflow downward. This is in contrast to the embodiment of FIGS. 1-6 where the fan units 14 are located vertically to draw the airflow sideways.

FIG. 8 illustrates another embodiment where the cooling apparatus 10 modifies the front-to-rear airflow to become front-to-both sides airflow with the fan tray 16 located vertical and at the rear side 44 of the cooling apparatus. Here and in FIG. 7, the fan tray 16 at the rear of the cooling apparatus 10 can be front removable via a handle 80 that allows the fan tray 16 to slide in and out.

FIG. 9 illustrates the airflow in the embodiment of FIGS. 1-6 where the front-to-back airflow of the network element 12 is modified by the cooling apparatus 10 to become front-to-side airflow.

Figure 10:
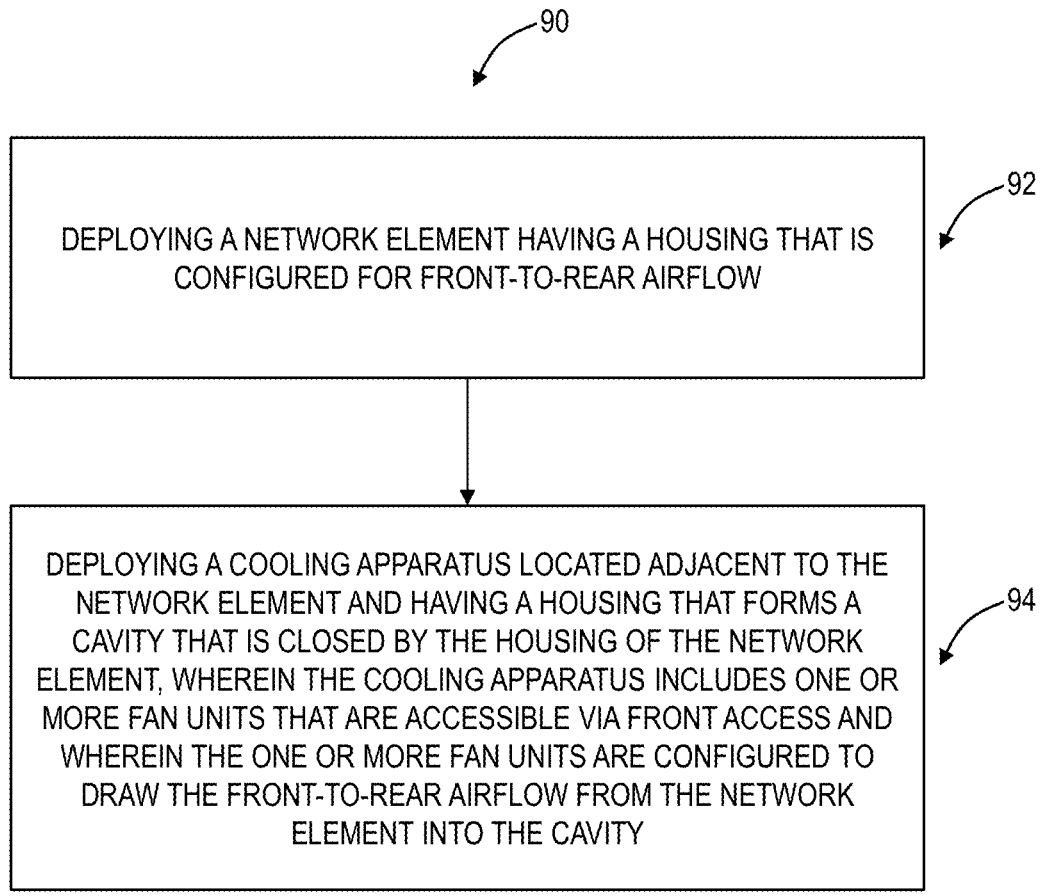
FIG. 10 is a flowchart of a process for modifying the airflow of a network element with a cooling apparatus.

FIG. 10 is a flowchart of a process 90 for modifying the airflow of a network element with a cooling apparatus. The process 90 includes deploying a network element having a housing that is configured for front-to-rear airflow (step 92); and deploying a cooling apparatus located adjacent to the network element and having a housing that forms a cavity that is closed by the housing of the network element, wherein the cooling apparatus includes one or more fan units that are accessible via front access and wherein the one or more fan units are configured to draw the front-to-rear airflow from the network element into the cavity (step 94).

In another embodiment, a system includes a network element 12 having a housing 20 that is configured for front-to-rear airflow; and a cooling apparatus 10 located adjacent to the network element and having a housing 40 that forms a cavity 52 that is closed by the housing 20 of the network element 12, wherein the cooling apparatus 10 includes one or more fan units 14 that are accessible via front access and wherein the one or more fan units 14 are configured to draw the front-to-rear airflow from the network element into the cavity 52.

The one or more fan units 14 can be located on a side of the cooling apparatus 10 and are configured to exhaust air in the cavity 52 on the side of the cooling apparatus 10, thereby converting the front-to-rear airflow to front-to-side airflow. The cavity 52 can include a baffle 58 for airflow in the cavity 52.

The one or more fan units 14 can be located at a rear of the cooling apparatus 10. The one or more fan trays 16 can be oriented horizontally and configured to draw the front-to-rear airflow downward into a duct 70 for exhaust out a rear side of the cooling apparatus 10. The one or more fan units 14 can oriented vertically and configured to draw the front-to-rear airflow into the cavity 52 for exhaust out each side of the cooling apparatus 10. The cooling apparatus 10 can include fiber and/or cable management 64 on a front side 42.

The cooling apparatus 10 can be 1 Rack Unit (RU) in height. The network element 12 can require rear access for fan replacement and is deployed where rear access is unavailable. The network element 12 can support fan units on a rear side and the fan units are unequipped with the cooling apparatus 10 present.

In a further embodiment, the cooling apparatus 10 includes a housing 40 having a front side 42, a rear side 44, a left side 46, a right side 48, and a bottom side 50, collectively forming a cavity 52; and one or more fan units 14 located in the cavity 52 and accessible from the front side 42; wherein the cooling apparatus 10 is placed adjacent to a network element 12 having a housing 20 that is configured for front-to-rear airflow, wherein the cavity 52 is closed by the housing 20 of the network element 13, and wherein the one or more fan units 14 are configured to draw the front-to-rear airflow from the network element 12 into the cavity 52.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A system comprising:
   a network element having a housing that is configured for front-to-rear airflow; and
   a cooling apparatus located adjacent to the network element and having a housing that forms a cavity that is closed by the housing of the network element, wherein the cooling apparatus includes one or more fan units that are accessible via front access and wherein the one or more fan units are configured to draw the front-to-rear airflow from the network element into the cavity.

2. The system of claim 1, wherein the one or more fan units are located on a side of the cooling apparatus and are configured to exhaust air in the cavity on the side of the cooling apparatus, thereby converting the front-to-rear airflow to front-to-side airflow.

3. The system of claim 2, wherein the cavity includes a baffle for airflow in the cavity.

4. The system of claim 1, wherein the one or more fan units are located at a rear of the cooling apparatus.

5. The system of claim 4, wherein the one or more fan units are oriented horizontally and configured to draw the front-to-rear airflow downward into a duct for exhaust out a rear side of the cooling apparatus.

6. The system of claim 4, wherein the one or more fan units are oriented vertically and configured to draw the front-to-rear airflow into the cavity for exhaust out each side of the cooling apparatus.

7. The system of claim 1, wherein the cooling apparatus includes fiber and/or cable management on a front side.

8. The system of claim 1, wherein the cooling apparatus is 1 Rack Unit (RU) in height.

9. The system of claim 1, wherein the network element requires rear access for fan replacement and is deployed where rear access is unavailable.

10. The system of claim 1, wherein the network element supports fan units on a rear side and the fan units are unequipped with the cooling apparatus present.

11. A cooling apparatus comprising:
    a housing having a front side, a rear side, a left side, a right side, and a bottom side, collectively forming a cavity; and
    one or more fan units located in the cavity and accessible from the front side;
    wherein the cooling apparatus is placed adjacent to a network element having a housing that is configured for front-to-rear airflow, wherein the cavity is closed by the housing of the network element, and
    wherein the one or more fan units are configured to draw the front-to-rear airflow from the network element into the cavity.

12. The cooling apparatus of claim 11, wherein the one or more fan units are located on a side of the cooling apparatus and are configured to exhaust air in the cavity on the side of the cooling apparatus, thereby converting the front-to-rear airflow to front-to-side airflow.

13. The cooling apparatus of claim 11, wherein the one or more fan units are located at a rear of the cooling apparatus.

14. The cooling apparatus of claim 13, wherein the one or more fan units are oriented horizontally and configured to draw the front-to-rear airflow downward into a duct for exhaust out a rear side of the cooling apparatus.

15. The cooling apparatus of claim 13, wherein the one or more fan units are oriented vertically and configured to draw the front-to-rear airflow into the cavity for exhaust out each side of the cooling apparatus.

16. The cooling apparatus of claim 11, wherein the cooling apparatus includes fiber and/or cable management on a front side.

17. The cooling apparatus of claim 11, wherein the cooling apparatus is 1 Rack Unit (RU) in height.

18. The cooling apparatus of claim 11, wherein the network element requires rear access for fan replacement and is deployed where rear access is unavailable.

\* \* \* \* \*